United States Patent
Xie et al.

(10) Patent No.: US 8,754,507 B2
(45) Date of Patent: Jun. 17, 2014

(54) FORMING THROUGH-SILICON-VIAS FOR MULTI-WAFER INTEGRATED CIRCUITS

(75) Inventors: Bin Xie, Hong Kong (HK); Pui Chung Simon Law, Hong Kong (HK); Yat Kit Tsui, Hong Kong (HK)

(73) Assignee: Hong Kong Applied Science and Technology Research Institute Company Limited, Hong Kong Science Park, Shatin, New Territories, Hong Kong (CN)

( * ) Notice: Subject to any disclaimer, the term of this patent is extended or adjusted under 35 U.S.C. 154(b) by 490 days.

(21) Appl. No.: 13/008,845

(22) Filed: Jan. 18, 2011

(65) Prior Publication Data

US 2012/0181698 A1     Jul. 19, 2012

(51) Int. Cl.
*H01L 29/40*     (2006.01)

(52) U.S. Cl.
USPC .......................................... 257/621; 257/626

(58) Field of Classification Search
USPC .......................................... 257/621, E23.001
See application file for complete search history.

(56) References Cited

U.S. PATENT DOCUMENTS

| | | | |
|---|---|---|---|
| 6,846,725 B2 | 1/2005 | Nagarajan et al. | |
| 6,852,627 B2 | 2/2005 | Sinha et al. | |
| 7,371,662 B2 | 5/2008 | Chiou | |
| 7,385,283 B2 | 6/2008 | Wu et al. | |
| 7,498,258 B2 | 3/2009 | Hiatt | |
| 7,524,753 B2 * | 4/2009 | Sunohara et al. | 438/598 |
| 7,847,386 B1 * | 12/2010 | Kim et al. | 257/686 |

* cited by examiner

*Primary Examiner* — Howard Weiss
*Assistant Examiner* — Steven Rao
(74) *Attorney, Agent, or Firm* — Ella Cheong Hong Kong; Sam T. Yip

(57) ABSTRACT

The present invention provides a method for forming a three-dimensional wafer stack having a single metallized stack via with a variable cross-sectional shape. The method uses at least first and silicon wafers. Each wafer has one or more integrated circuits formed thereon. One or more through-vias are formed in each silicon wafer followed by oxide formation on at least an upper and lower surface of the silicon wafer. The wafers are aligned such that each wafer through via is aligned with a corresponding through via in adjacent stacked wafers. Wafers are bonded to form a three-dimensional wafer stack having one or more stack vias formed from the alignment of individual wafer vias. Via metallization is performed by depositing a seed layer in each of the stack vias followed by copper electroplating to form a continuous and homogeneous metallization path through the three-dimensional wafer stack.

20 Claims, 12 Drawing Sheets

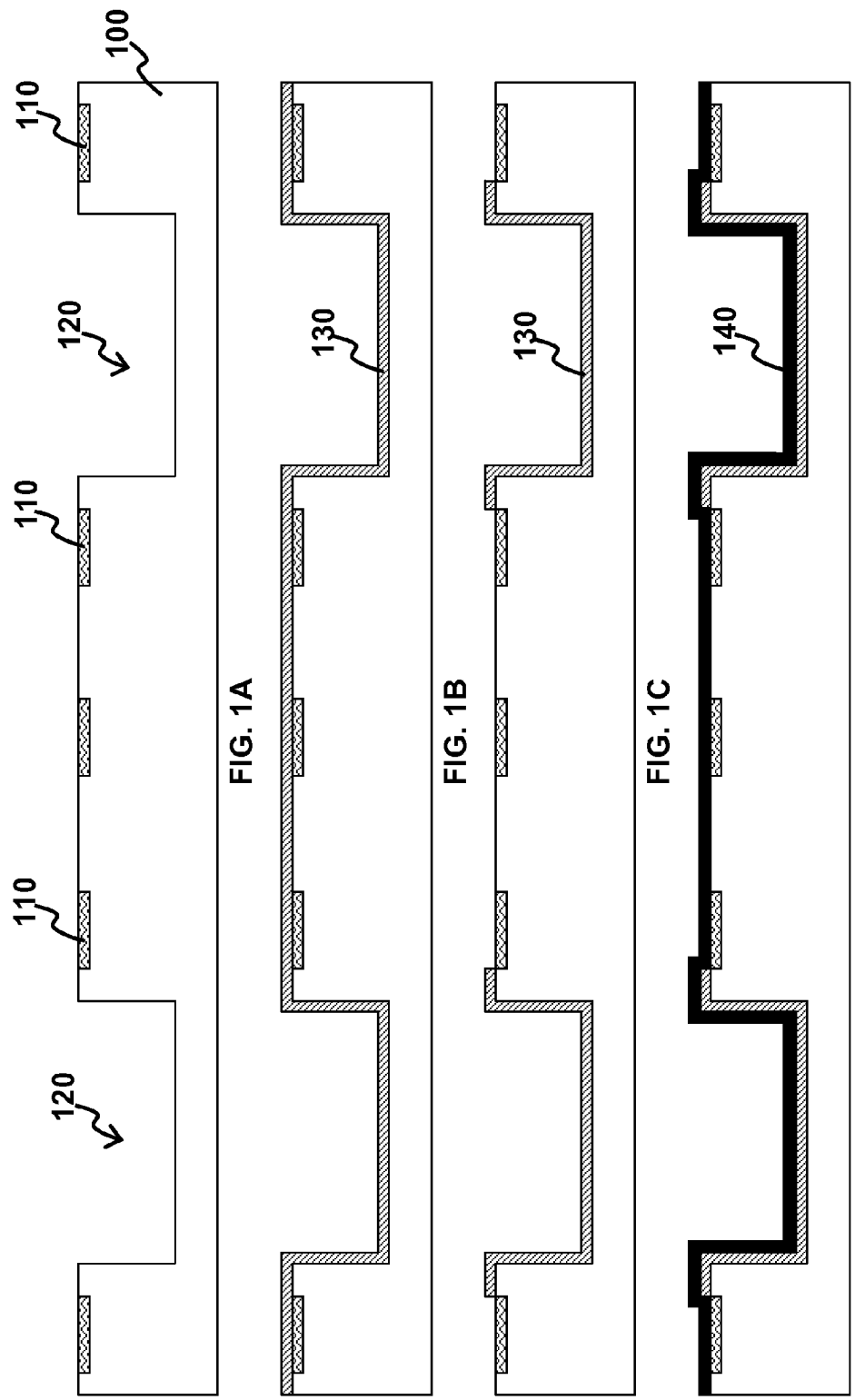

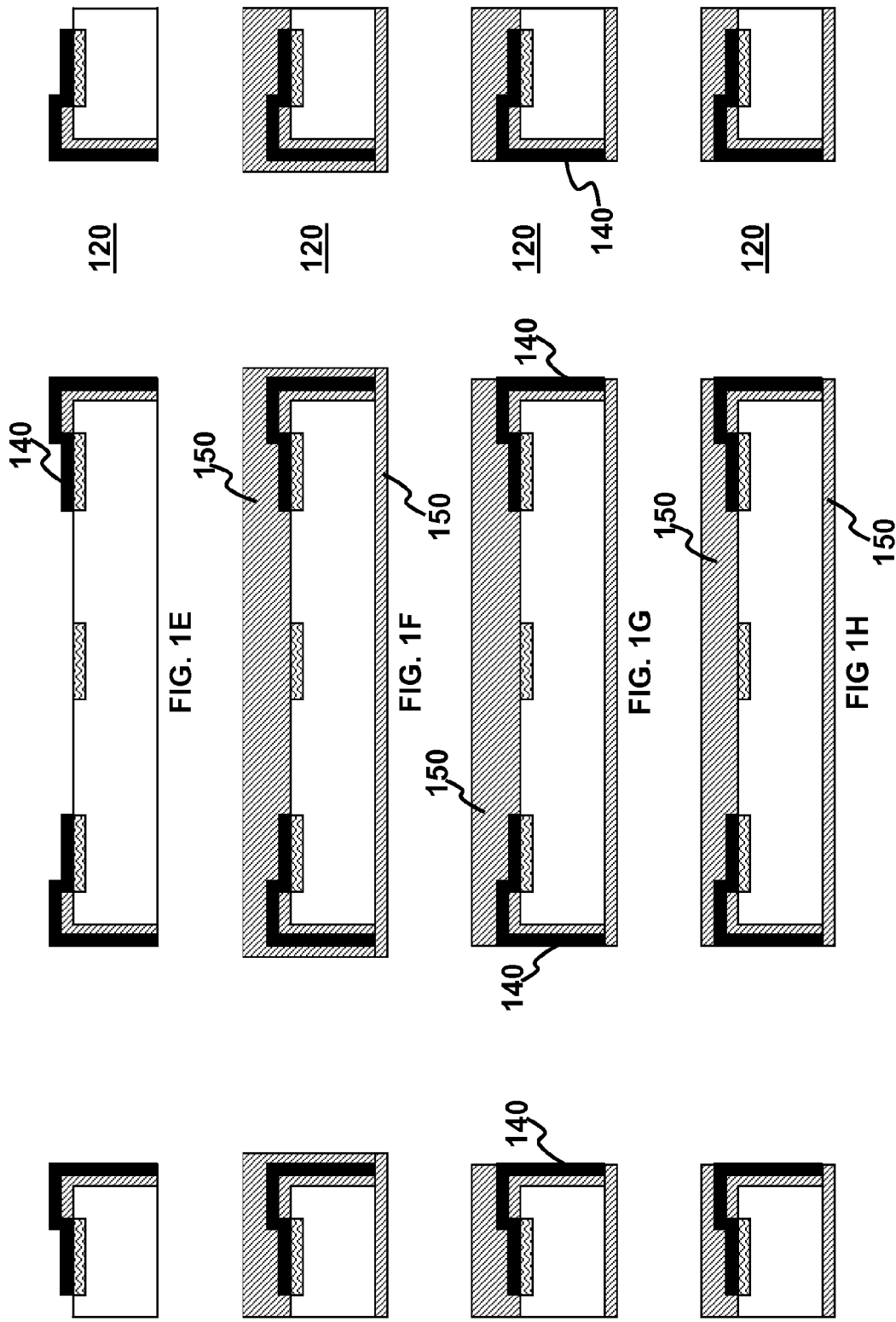

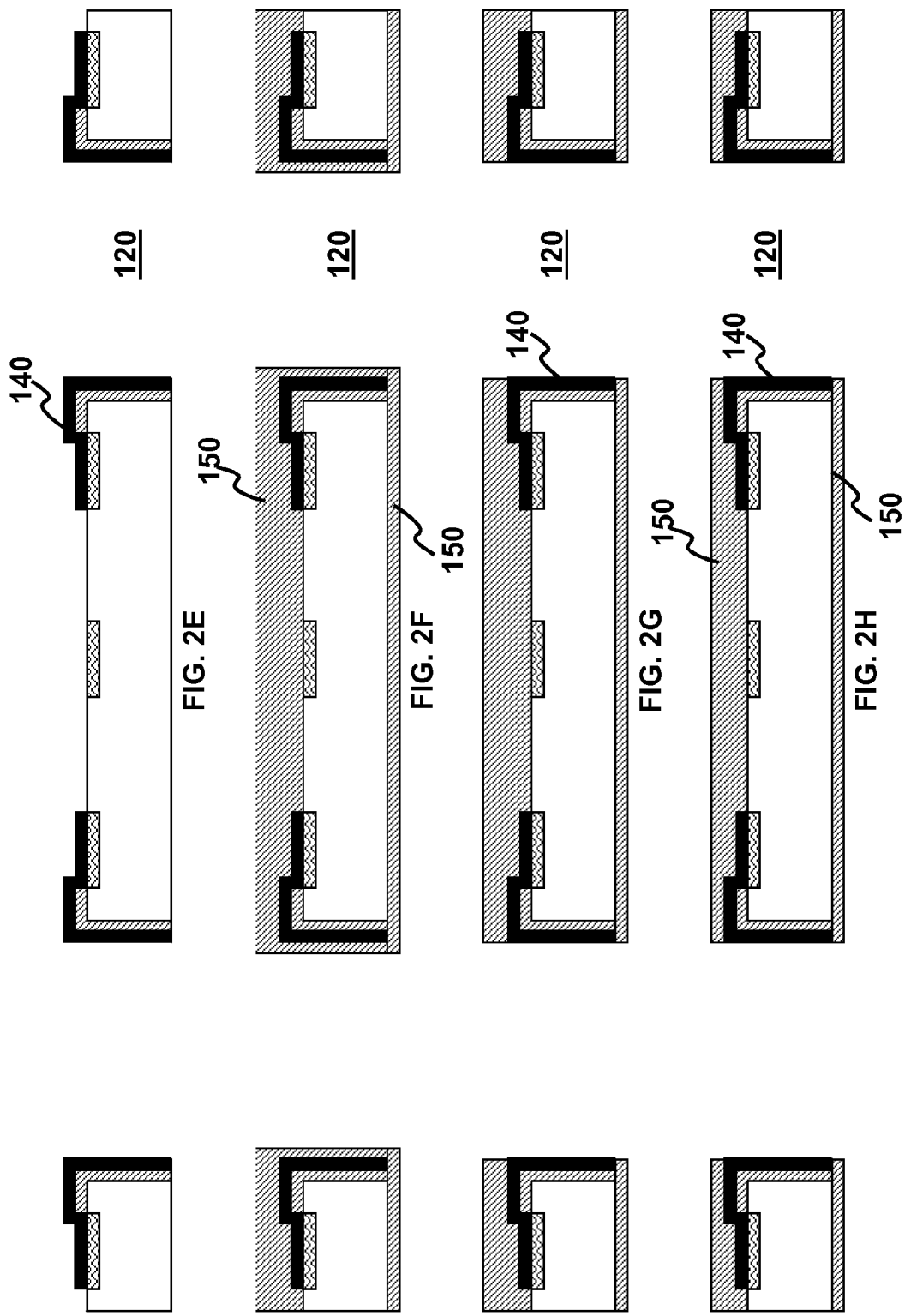

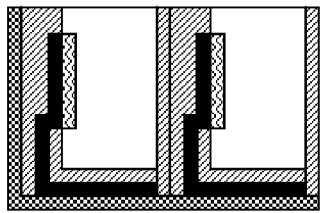
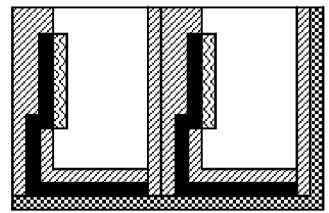
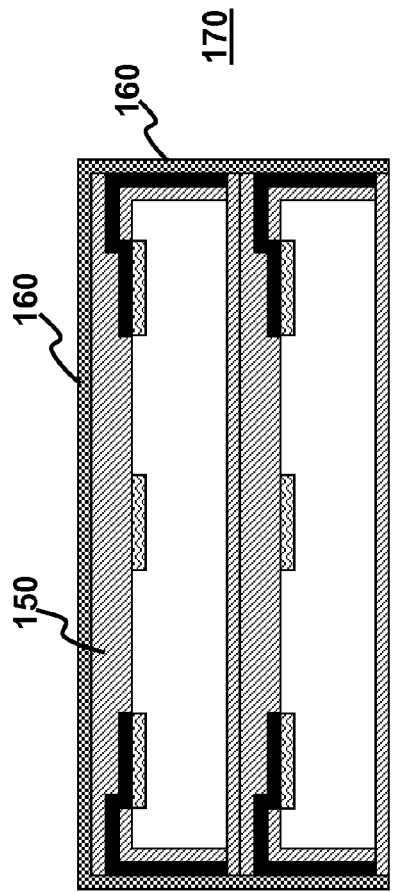
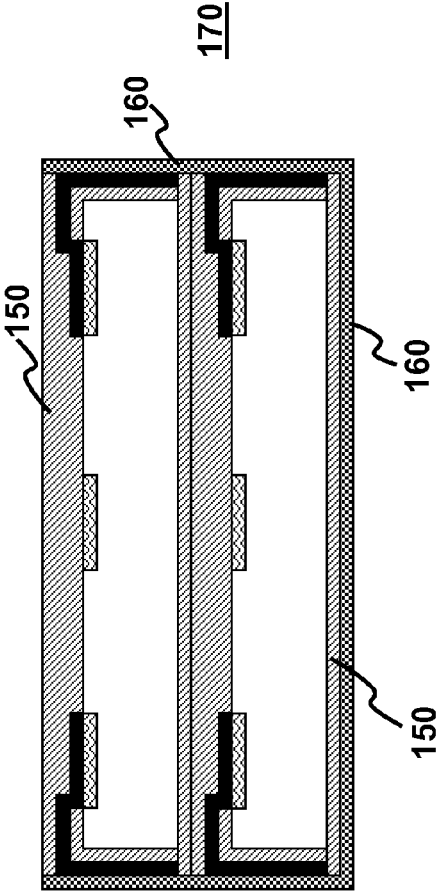
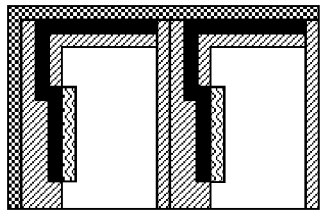
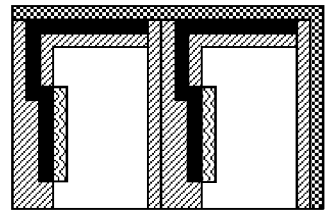
FIG. 3A Cu Seed Sputtering from Top when IC Face-Up
FIG. 3B Cu Seed Sputtering from Bottom when IC Face-Up

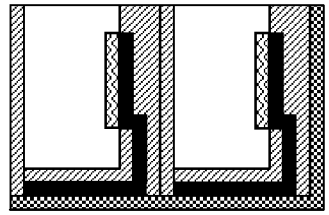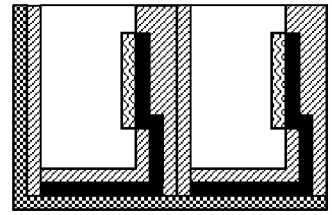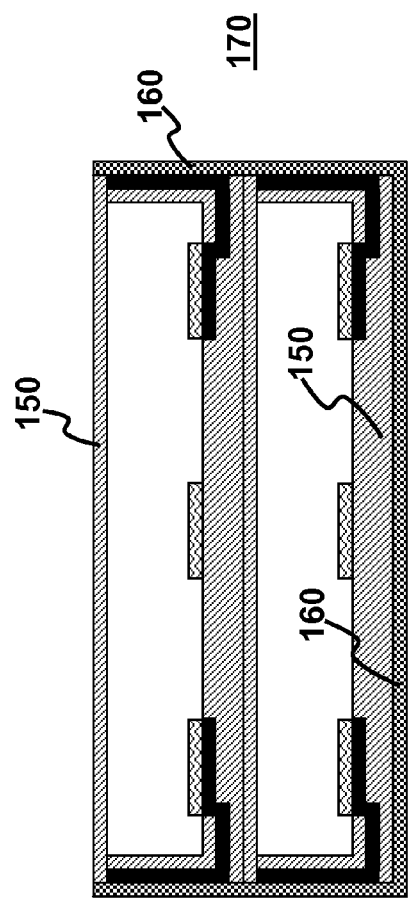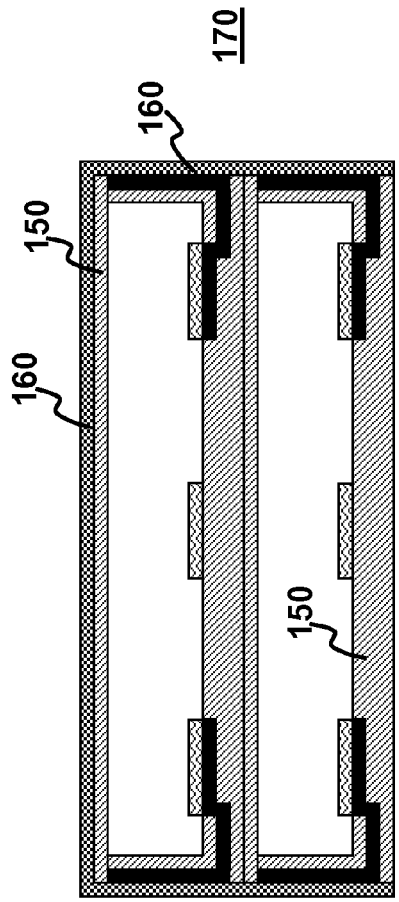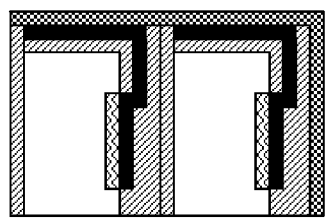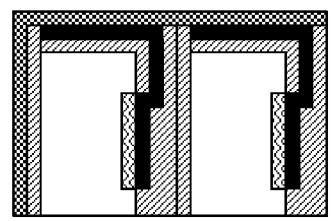
FIG. 4A Cu Seed Sputtering from Bottom when IC Face-Down
FIG. 4B Cu Seed Sputtering from Top when IC Face-Down

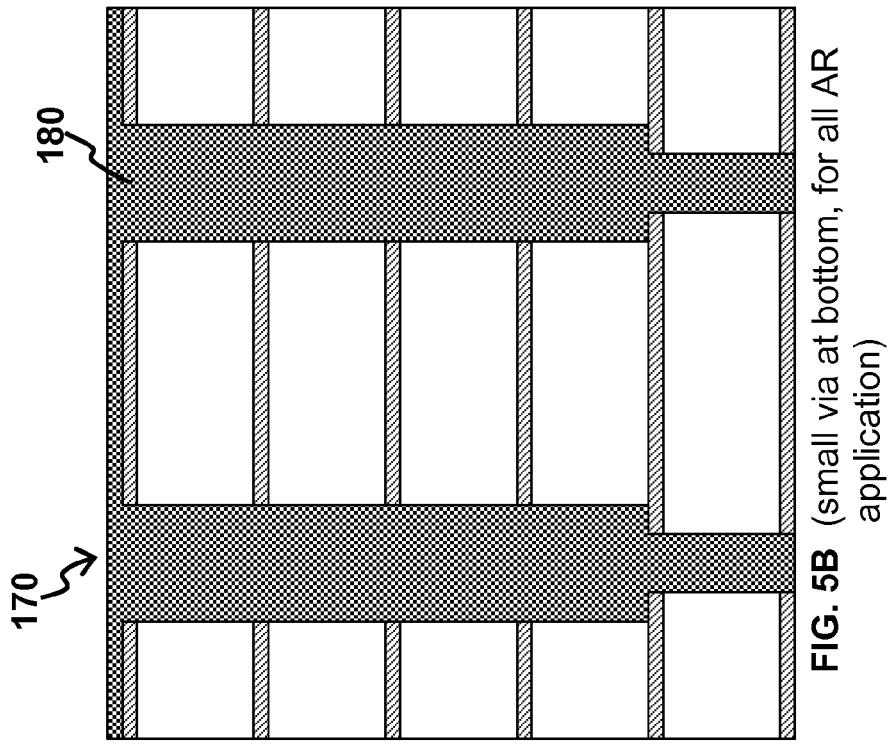
FIG. 5B (small via at bottom, for all AR application)
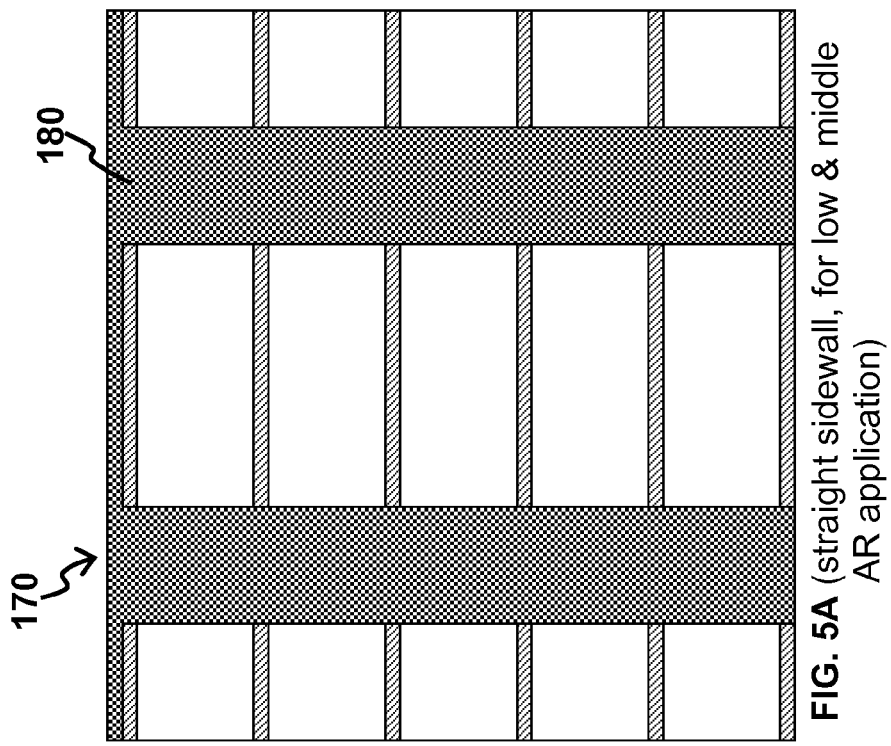
FIG. 5A (straight sidewall, for low & middle AR application)

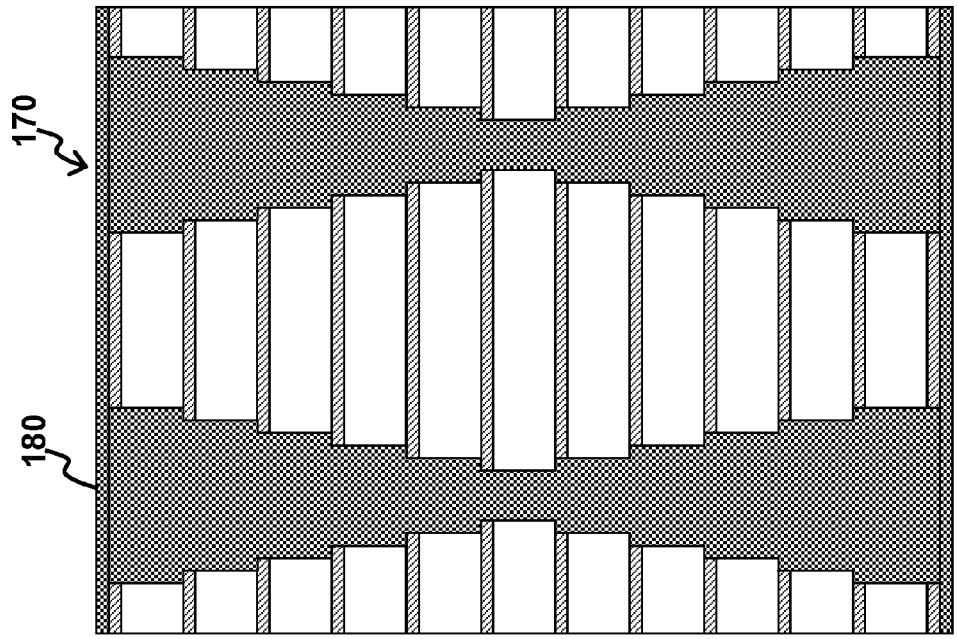
FIG. 5D ("hourglass sidewall, for high AR application")
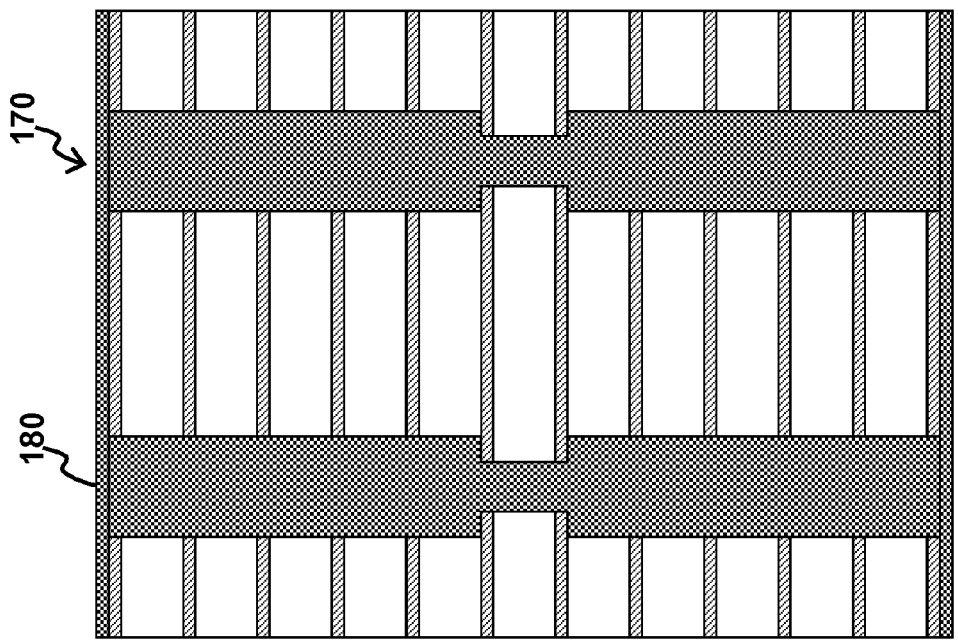
FIG. 5C ("dumbbell" sidewall, for high AR application)

FORMING THROUGH-SILICON-VIAS FOR MULTI-WAFER INTEGRATED CIRCUITS

FIELD OF THE INVENTION

The present invention relates to three dimensional integrated circuit fabrication and, more particularly, to bonding of individual integrated circuits having vias formed therein followed by via metallization.

BACKGROUND OF THE INVENTION

As integrated circuit dimensions have moved progressively smaller, they are approaching a physical limit below which devices cannot be fabricated. Therefore, the traditional two-dimensional model of integrated circuits is undergoing a change towards three-dimensional integration. There are many challenges to overcome to make the progression to a three-dimensional paradigm. First, most integrated circuit fabrication techniques rely on modifying a wafer surface in some manner to form components and metallization paths. Therefore three-dimensional integration will likely rely on multiple stacked wafers with devices formed in each individual wafer.

Stacking multiple wafers presents many challenges. To adhere multiple wafers to one another, the wafers must be extremely flat to ensure wafer-to-wafer contact. Another challenge is interconnection among the devices positioned on various wafers. This requires vertical metallization to integrate devices positioned on different wafer.

U.S. Pat. No. 7,385,283 describes a method for making a three-dimensional integrated circuit. In this method, metal interconnects are aligned and a metal to metal bond formed during wafer stacking. At the same time, a non-metal to non-metal bond is formed between adjacent wafers. While this technique is one approach to vertical integration, the metallization of vias prior to wafer bonding can create problems during the wafer bonding process. If heat is used to bond the wafers, metal ions may diffuse into the wafer-to-wafer bonding region; for copper via metallization, diffused copper can "poison" nearby devices. For silicon wafers, copper doping forms deep level traps, seriously affecting the electrical properties of the overall 3-D stack. If chemical mechanical polishing is performed prior to the bonding, the metallization in the vias may not be even with the surface, resulting in difficulty forming a metal-to-metal bond between adjacent wafer vias and possible "shorts" between device levels. Further, the need to perform via metallization on each individual wafer followed by inter-wafer via bonding adds expensive and time-consuming processing steps to the overall process.

Thus there is a need in the art for improved techniques for vertical integration of wafers to form multi-layer integrated circuits.

SUMMARY OF THE INVENTION

The present invention provides a method for forming a three-dimensional wafer stack having a single metallized via through the stack (a "stack via") which can have a variable cross-sectional shape. The present method uses at least first and silicon wafers. Each wafer has one or more integrated circuits formed thereon. One or more through-vias are formed in each silicon wafer followed by oxide formation on at least an upper and lower surface of the silicon wafer. The wafers are aligned such that each wafer through-via is aligned with a corresponding through via in adjacent stacked wafers. Wafers are bonded to form a three-dimensional wafer stack having one or more stack vias formed from the alignment of individual wafer vias. Via metallization is performed by forming a seed layer, optionally a copper seed layer, in each stack via followed by copper electroplating to form a continuous and homogeneous metallization path through the three-dimensional wafer stack.

BRIEF DESCRIPTION OF THE DRAWINGS

FIGS. 1A-1J depict a process for forming a three-dimensional wafer stack with a continuous and homogenous metallization path in a through-via according to the present invention.

FIGS. 2A-1J depict a process for forming a three-dimensional wafer stack with a continuous and homogenous metallization path in a through-via according a further embodiment of the present invention.

FIGS. 3A-3B depict a copper seed sputtering process.

FIGS. 4A-4B depict a further copper seed sputter process.

FIGS. 5A-5D depict various via cross-sectional shapes that can be formed according to the process of the present invention.

DETAILED DESCRIPTION

Figure 1I:
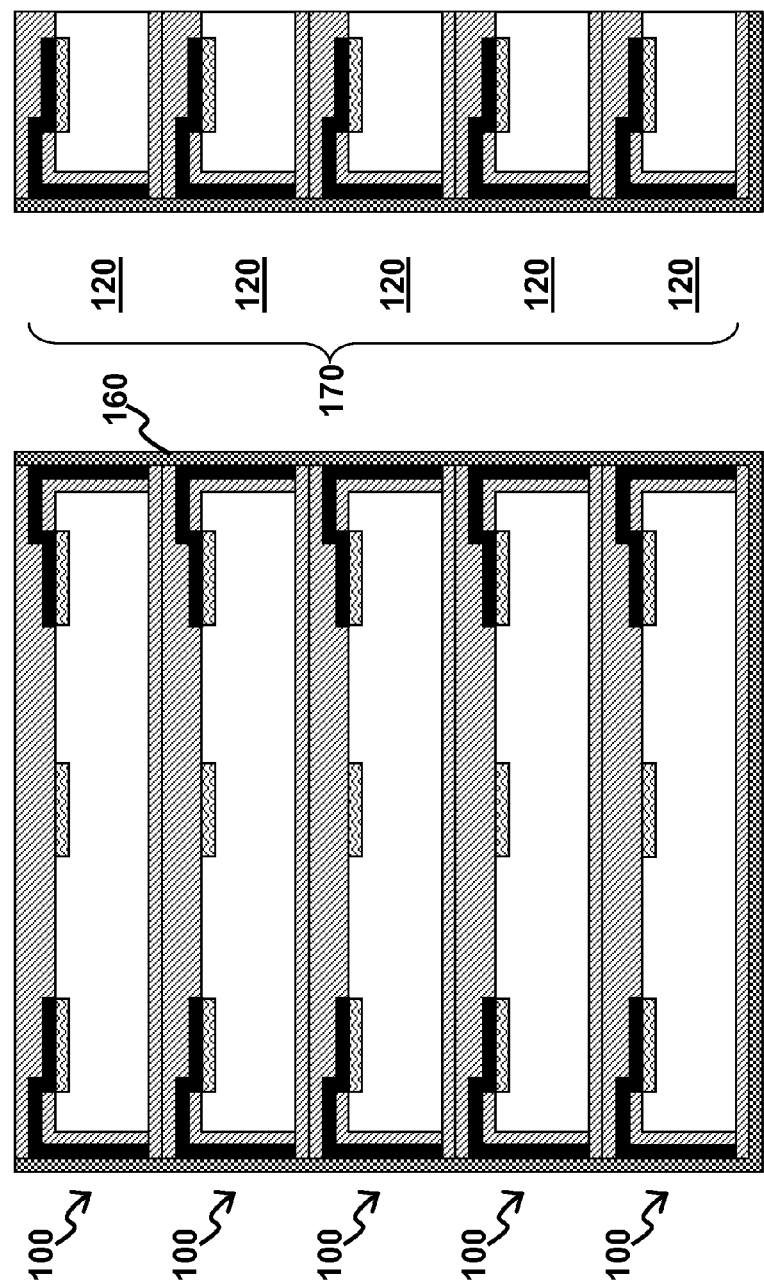
Figure 1I:
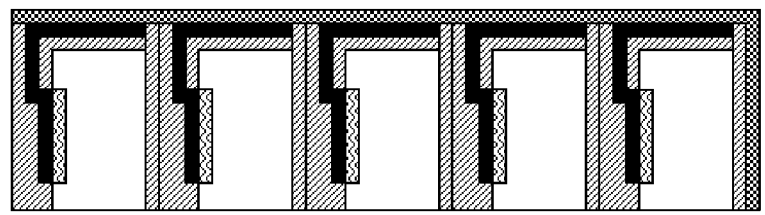

Turning to the drawings in detail, FIG. 1A depicts a first silicon wafer 100 for forming the three-dimensional bonded wafer stack according to the present invention. Wafer 100 includes various components, metallizations, integrated circuits, etc. 110 as are known in the integrated circuit fabrication art and which may be formed by any known technique. Trenches 120 are created through a suitable etching process such as deep reactive ion etching (DRIE). Trenches 120 will become vias in a later process.

In FIG. 1B, a layer of silicon oxide 130 (e.g., silicon dioxide) is deposited by any known technique such as plasma-enhanced chemical vapor deposition (PECVD), sputtering, etc. This material also covers the sidewalls of trench 120 to act as a barrier between the via metallization and the devices. Other isolation materials (e.g., polymers) and deposition techniques can also be used to form isolation layer 130. In FIG. 1C, a portion of the silicon oxide is removed to expose elements 110. In FIG. 1D, a layer of metal 140 is deposited to connect the integrated circuits 110 with trenches/vias 120. In an exemplary embodiment, the metal is a TiW alloy and is deposited by sputtering. The metal layer further forms a barrier to prevent diffusion of copper into silicon. Copper doping of silicon results in the formation of deep level traps, deleteriously affecting the electrical device properties. Other metal alloys and deposition techniques can also be used to form layer 140.

To turn trench 120 into a through-via, wafer thinning is performed in FIG. 1E, removing the bottom portion of the trench resulting in a through hole. A portion of layer 140 is also removed to isolate the electrical connections among certain adjacent through-vias in one wafer. In FIG. 1F, a further layer of silicon oxide (e.g., silicon dioxide) is formed. The silicon oxide can be grown or deposited through conventional techniques.

Silicon oxide formed on via 120 sidewalls is removed in FIG. 1G, exposing metal layer 140. As the wafers which make up the multi-wafer stack should be extremely flat, polishing of the silicon oxide of at least the top surface is performed in FIG. 1H. Polishing may be through chemical, mechanical, or chemical-mechanical techniques as is known in the art.

In FIG. 1I, plural wafers 100 with integrated circuits formed thereon are stacked such that the centers of vias 120 are aligned forming a continuous via 170 in the multi-wafer stack. The continuous via thus formed can then be metallized to form a uniform metal path through the stack and is therefore termed the "stack via" as it is the continuous path formed in the wafer stack. In the exemplary embodiment of FIG. 1I, five wafers 100 are depicted; however, it is understood that two or more wafers are contemplated by the embodiments of the present invention. Because oxide is present on both the upper and lower surfaces of each wafer, each wafer oxide surface contacts an adjacent wafer oxide surface. This configuration permits the wafers to be unified into a three-dimensional wafer stack by bonding. In the bonding process, covalent bonds are formed between silicon and oxygen atoms in adjacent layers, creating a unified structure without the need to add bonding agents between wafers. Low elevated temperatures (below approximately 200.degree. C.) and/or pressure assist in the bond formation, although the bonding can also be performed at ambient temperatures, e.g., with a pre-treatment using plasma with an NH.sub.4OH dip on the wafer surface. The bonding process time per wafer pair is around 3-6 min, which is less than that for conventional bonding methods. Advantageously, since no copper is present during the bonding process, there are no problems with copper diffusion into unwanted regions of the wafer and no metal-to-metal bonding as in the prior art. Further, the use of low-temperature bonding minimizes residual stress in the multi-wafer structure.

Figure 1J:
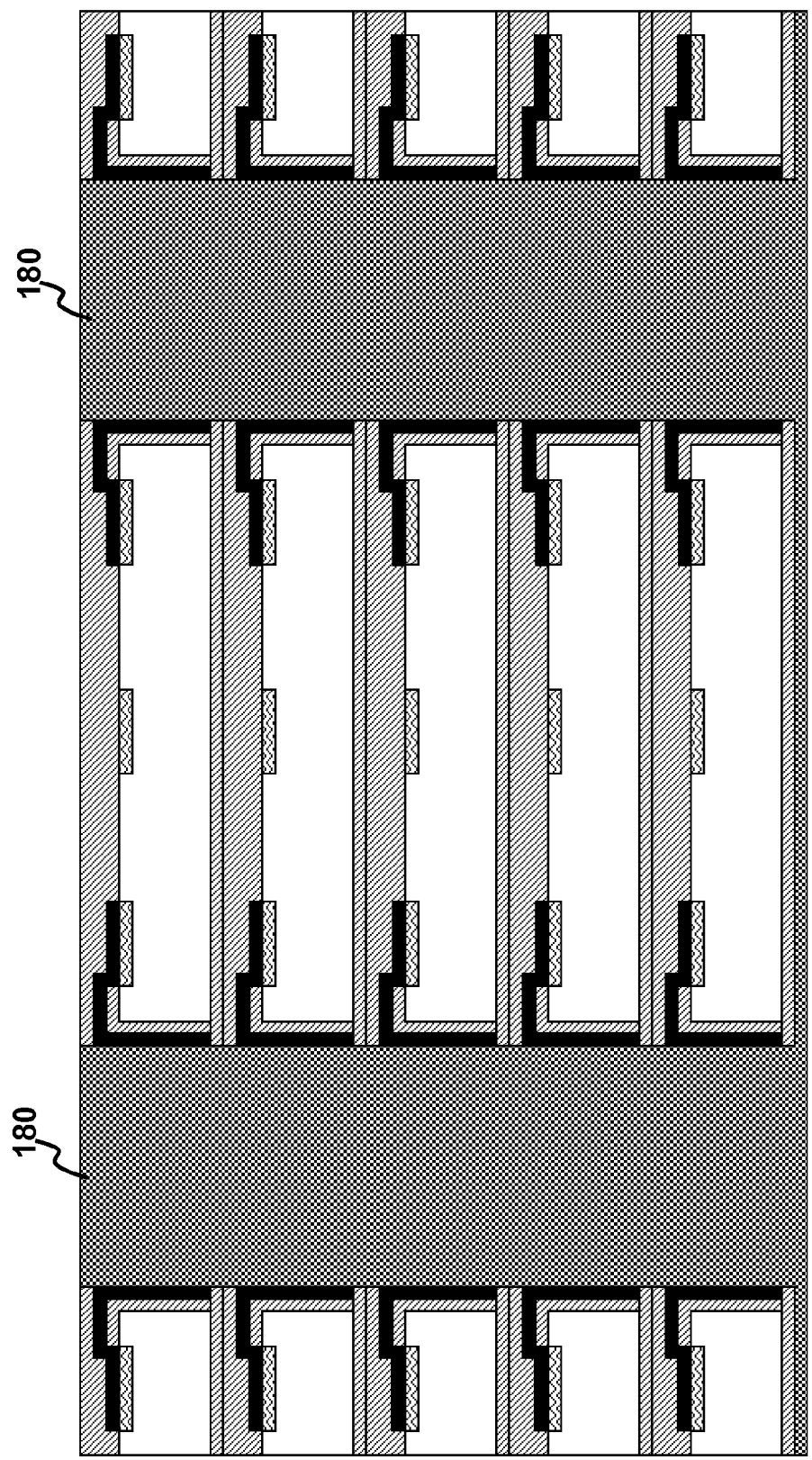
Figure 2A:
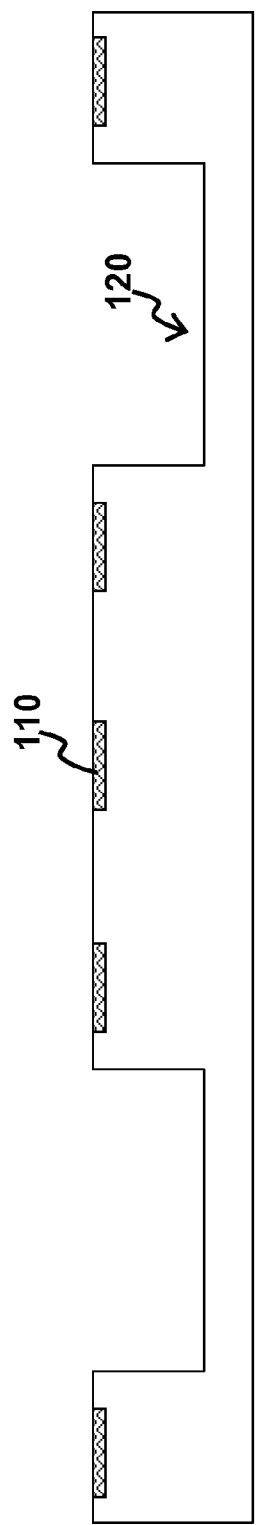
Figure 2B:
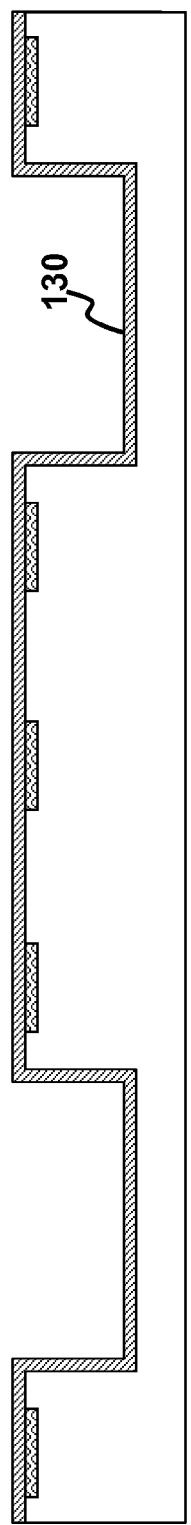
Figure 2C:
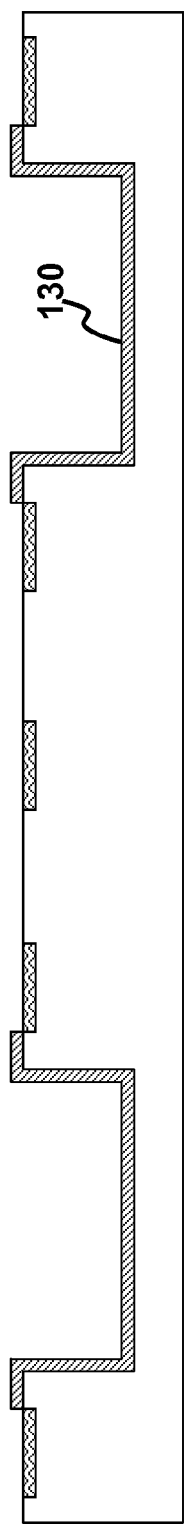
Figure 2D:
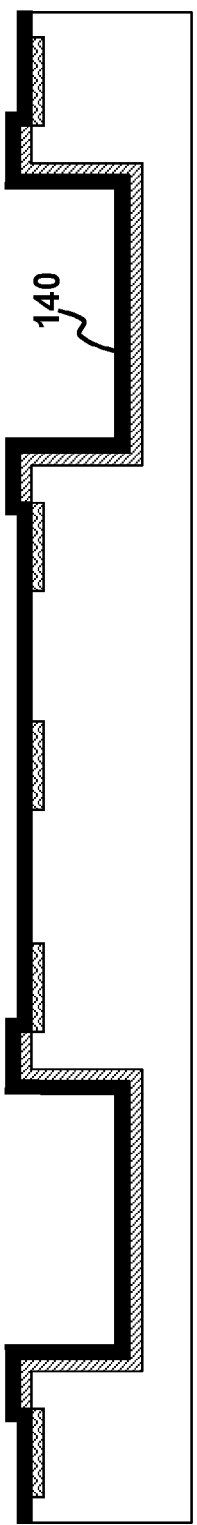
Figure 2I:
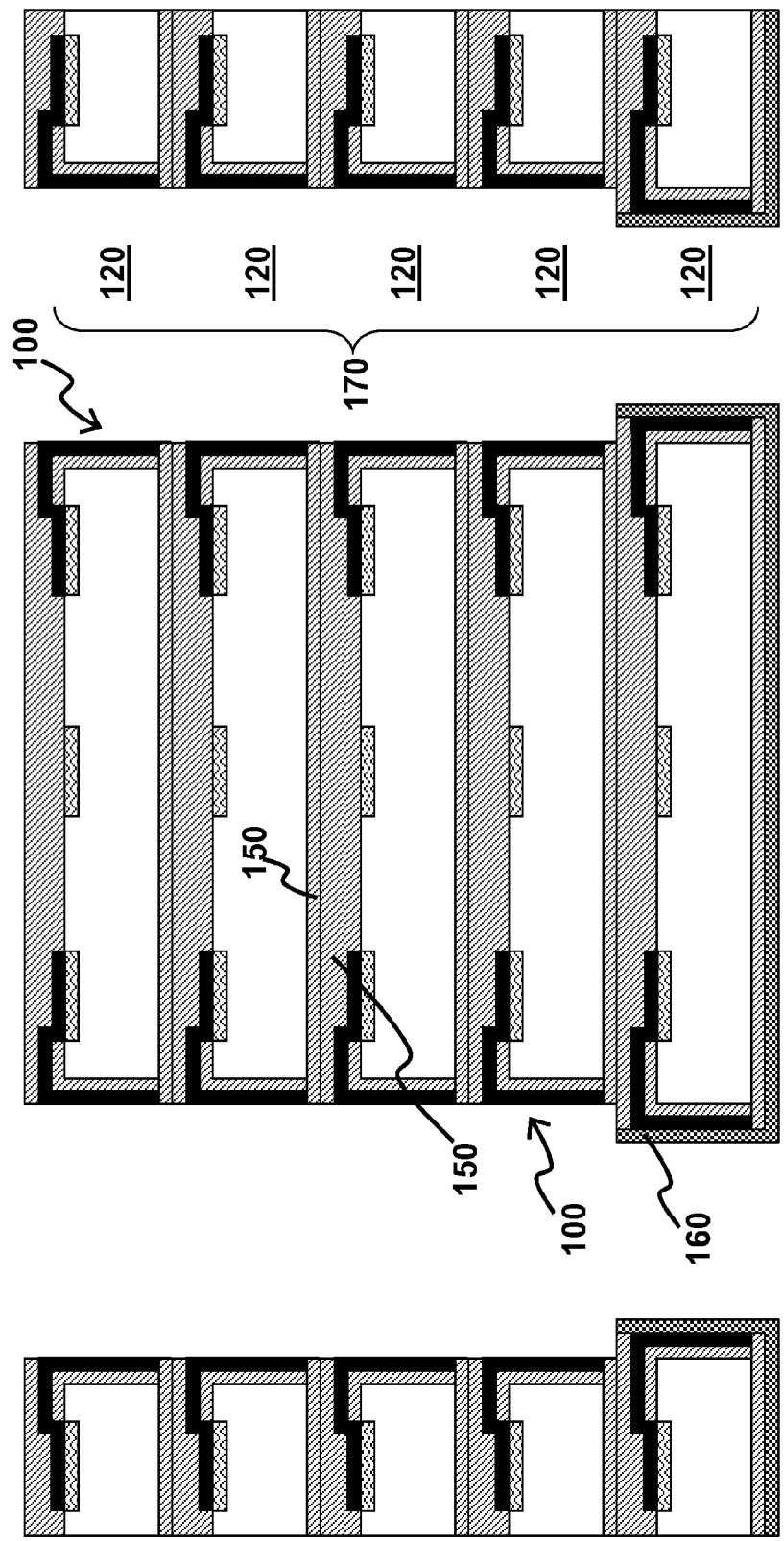
Figure 2J:
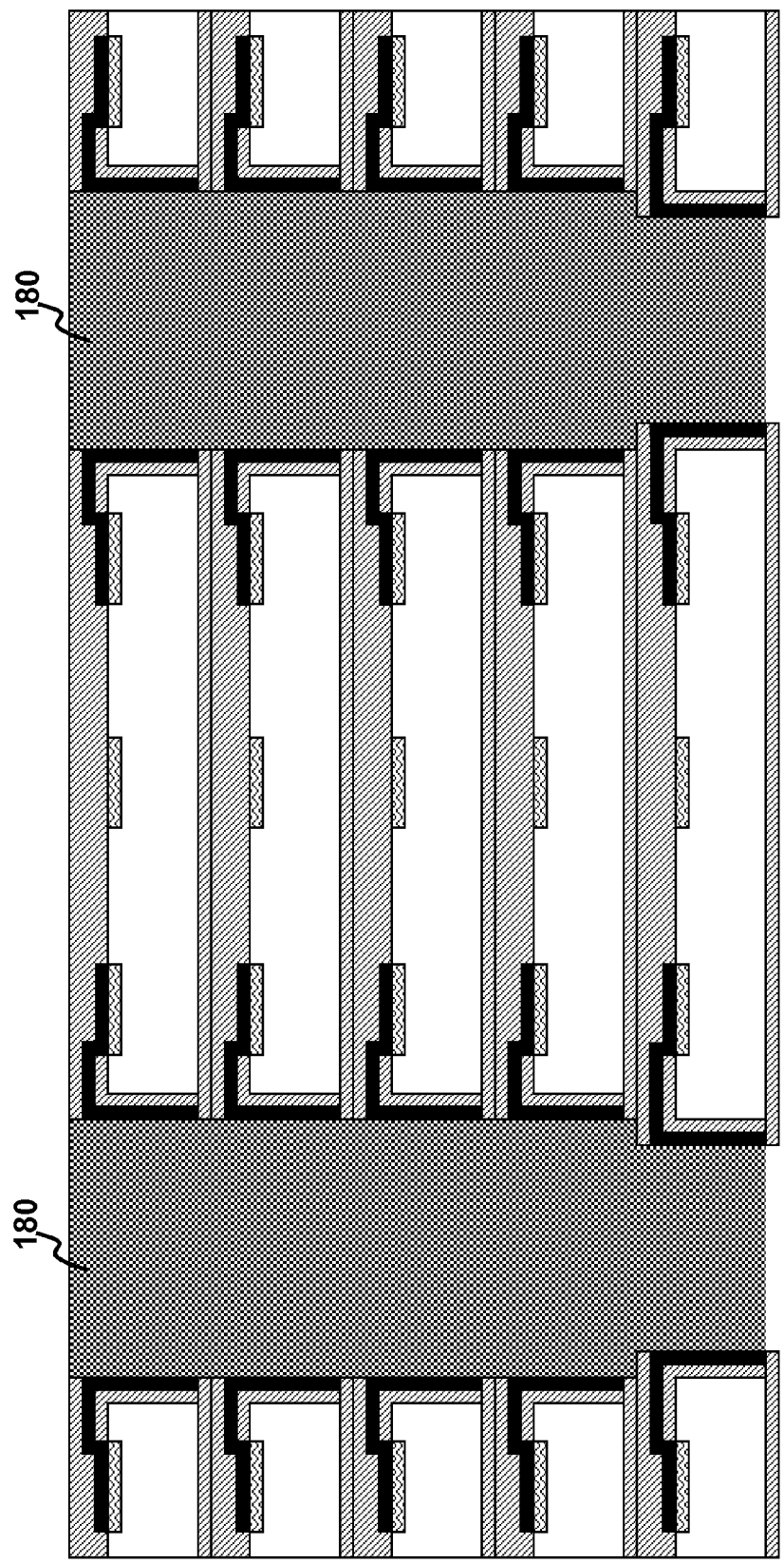

Following the bonding process, a seed layer 160 is formed on at least a portion of the sidewalls of the multi-wafer stack via 170. Optionally, this seed layer may be a copper seed layer formed by sputtering, although other seed layer materials and methods such electroless deposition of other metals or sputtering of other common connector materials such as aluminum can also be used. Although the layer 170 is shown as being continuous, the seed layer is sufficiently thin that there may be some discontinuities along the via sidewalls. If there are discontinuities in the copper seed layer, such discontinuities can be repaired by various seed repairing processes such as by putting a bonded wafer stack into seed repairing solutions, e.g., with palladium content 100 mg/L, hydrochloric acid content 2 mol/L, bath temperature around 30° C. and soaking time around one minute. In FIG. 1J, a seed layer of copper is used in an electroplating process to fill the stack via 170 with a continuous and homogeneous layer of copper 180. In a preferred embodiment, copper layer 180 has a uniform crystal lattice and grain size.

FIG. 2 depicts a process for forming a three dimensional bonded wafer stack according to a further embodiment of the present invention. The process of FIGS. 2A-2H are substantially similar to the processes of FIGS. 1A-1H and will not be further described here. In the process of FIG. 2, the cross-section of the stack through-via 170 can vary along the thickness of the multi-wafer stack. To vary the cross-section, individual wafers 100 having different via sizes 120 are aligned based on a via center point, that is, the centers of the vias are aligned, as seen in FIG. 2I. In this manner, through-vias having a variety of cross-sectional shapes can be formed (depicted in more detail in FIG. 5). In FIG. 2I, wafers 100 are bonded to one another through oxide layers 150. A seed layer of, for example, copper 160 is sputtered onto a portion of stack via 170's sidewalls. In the embodiment depicted, only the first wafer receives a sputtered copper seed layer. In FIG. 2J, electroplating is used to fill stack via 170 with a continuous and homogeneous layer of copper 180, preferably having a uniform crystal lattice and grain size. Because only the first wafer receives a sputtered copper seed layer, the electroplating proceeds in a "bottom-up" manner, i.e., copper is firstly deposited on the portions having a copper seed layer, then deposited upwards until the entire multi-wafer stack via is filled. The "bottom-up" process can help improve electroplating quality and achieve void-free copper vias.

FIGS. 3A-3B and 4A-4B respectively depict copper seed layer sputtering from the top and from the bottom of a multilayer stack when the IC-containing layer is face-up or face-down. Depending upon the direction, an external surface of wafer 120 also receives sputtered copper over oxide layer 150. Any of the techniques may be selected depending upon the desired location of an external surface copper layer which can be patterned and used as a bonding pad/electrode/connection element. Alternatively, the copper layer on the external surface can be removed following electroplating.

FIGS. 5A-5D depict various cross-sectional configurations that can be formed according to the via-center aligning techniques of the present invention. By aligning the via centers, wafers having vias 120 with different cross-sectional thicknesses can be bonded together to form an overall stack via 170 configuration of an arbitrary shape depending upon the application of the multi-wafer stack. FIGS. 5A and 5B correspond respectively to FIGS. 1J and 2J. FIG. 5A is suitable for low and medium aspect ratio applications while FIG. 5B is suitable for low, medium, and high aspect ratio applications, because it involves the "bottom-up" electroplating process.

FIG. 5C depicts an embodiment suitable for high aspect ratio applications having a "dumbbell" cross-sectional shape for stack via 170. Another embodiment for high aspect ratio applications is shown in FIG. 5D having an "hourglass" cross-sectional shape for via 170. For the embodiments depicted in FIGS. 5C and 5D, because the via sizes of the middle wafers are smaller than that of other wafers, the vias of middle wafers are fully electroplated by copper before the other wafers. Then copper then is deposited upward and downward in the multi-wafer thickness directions simultaneously. Therefore, the electroplating for high aspect ratio applications is converted into simultaneous electroplating for low or middle aspect ratio applications. Advantageously, the conversion of electroplating from high aspect ratio applications to low or middle aspect ratio applications not only achieves better plating quality but also reduces plating time. Essentially, the embodiment for high aspect ratio applications can be applied for low or middle aspect ratio applications.

The present invention advantageously forms the via metallization 180 for the stack via 170 resulting in a homogenous metal layer having a substantially uniform crystal lattice and grain size. Further, by plating the entire via in a single process, arbitrary via cross-sectional shapes can be achieved that are not possible through individual wafer via to individual wafer via bonding. Process time is substantially reduced as is the risk of unwanted copper diffusion into semiconductor materials or IC devices. The resulting multi-wafer stacks of the present invention are ultra-thin, in part due to the wafer thinning of FIGS. 1E and 2E.

Following electroplating, the multi-wafer stack may be formed into individual semiconductor elements. As used herein, the term "semiconductor element" means a semiconductor device or a semiconductor component. When the multi-wafer stack includes plural semiconductor elements, individual elements are formed by separation from the stack. The separation can be performed by sawing, dicing, etching, or other known separation techniques. In some embodiments, the multi-wafer stack forms a single semiconductor device or component. For these embodiments, "forming" the individual semiconductor element is essentially complete following electroplating but can include any finishing techniques used to form the final device/component.

Further advantages and modifications of the present invention will be apparent to those of ordinary skill in the art. Modifications such as those suggested above, but not limited thereto, are considered to be within the scope of the following claims.

What is claimed is:

1. A method for vertically integrating plural semiconductor wafers, each semiconductor wafer including one or more integrated circuits, one or more through vias and a metal layer electrically connecting the integrated circuits with vias fabricated thereon comprising:
    aligning at least first and second silicon wafers such that a center of each of the one or more through vias of the first wafer aligns with a center of each of corresponding through vias in the second wafer;
    bonding at least the first and second silicon wafers to form a three-dimensional wafer stack having one or more stack vias formed from the alignment of via centers of at least the first and second wafers;
    forming a metal seed layer on at least a portion of each of the one or more stack vias;
    electroplating the stack via using the metal seed layer to form a continuous and homogeneous metallization path through the three-dimensional wafer stack; and
    forming individual three-dimensional semiconductor elements from the three-dimensional wafer stack.

2. A method according to claim 1 further comprising:
    etching trenches in the semiconductor wafers at future through via positions;
    forming an oxide layer on at least an upper and lower surface of each silicon wafer;
    forming a barrier layer to connect the integrated circuits with the future through vias and to prevent metal diffusion into the silicon wafers;
    performing wafer thinning to remove the bottom portion of the trenches resulting in formation of through vias;
    forming a further oxide layer on the semiconductor wafer surfaces and inside the through vias;
    removing the oxide layer formed on the through via sidewalls;
    performing wafer polishing of the oxide layer formed on at least the top surface of the semiconductor wafer to ensure an extremely flat wafer surface.

3. A method according to claim 1 wherein the through via of the first wafer has a diameter different from the through via of the second wafer.

4. A method according to claim 1 wherein the bonding process is a low temperature bonding performed at temperatures less than approximately 200° C.

5. A method according to claim 1 wherein the seed layer is deposited along the length of the stack via.

6. A method according to claim 1 further comprising bonding a plurality of additional wafers to form the three-dimensional stack.

7. A method according to claim 6 wherein the plurality of different wafers have through vias of different widths such that the stack via formed following the bonding has an arbitrary cross-sectional shape.

8. A method according to claim 7 wherein the arbitrary cross-sectional shape is an hourglass or dumbbell shape.

9. A method according to claim 1 wherein the homogenous metallization has a substantially uniform crystal lattice structure and grain size.

10. A method according to claim 1 wherein the first wafer is the bottom wafer of the three-dimensional wafer stack and has a through-via with a smaller cross-sectional diameter than the through via of the second wafer.

11. A method according to claim 10 wherein forming the copper seed layer is performed only on the bottom wafer and its through via and electroplating proceeds from the bottom wafer to a top wafer of the three-dimensional wafer stack.

12. A method according to claim 1 wherein the seed layer is formed by sputtering.

13. A method according to claim 1 wherein the forming of the individual semiconductor elements is performed by separating the individual semiconductor elements from the wafer stack.

14. A semiconductor element comprising one or more integrated circuits, one or more through vias and a metal layer electrically connecting the integrated circuits with vias fabricated thereon, the semiconductor element being formed from a three-dimensional wafer stack comprising:
    a first silicon wafer including one or more integrated circuits and having a first via having a first via diameter;
    a second silicon wafer having one or more integrated circuits positioned adjacent the first silicon wafer and having a second via having a second via diameter, the first and second wafers being aligned such that a center of the first via coincides with a center of the second via, the first and second wafers being bonded together without a metal bond between the first and second vias;
    a metal seed layer positioned on at least a portion of each of the first via and the second via of the bonded first wafer and the second wafer;
    an electroplated metal layer positioned over the metal seed layer to form a continuous and homogeneous metallization path through the bonded first and second silicon wafers.

15. A semiconductor element according to claim 14, wherein:
    the first wafer via has a diameter different from the second wafer via.

16. A semiconductor element according to claim 14, wherein the first wafer is the bottom wafer of the three-dimensional wafer stack and has a through-via with a smaller cross-sectional diameter than the through via of the second wafer, and wherein forming the metal seed layer is performed only on the bottom wafer and its through via and electroplating proceeds from the bottom wafer to a top wafer of the three-dimensional wafer stack.

17. A semiconductor element according to claim 14, further comprising:
    individual semiconductor devices formed from separated portions of the semiconductor element.

18. A semiconductor element according to claim 14 wherein the homogenous metallization has a substantially uniform crystal lattice structure and grain size.

19. A semiconductor element formed according to claim 14 wherein the wafer stack comprises a plurality of wafers having through vias of different widths such that a stack via formed following bonding has an arbitrary cross-sectional shape.

20. A semiconductor element formed according to claim 14 wherein the first and second vias are unmetallized prior to bonding.

* * * * *